United States Patent [19]

Anemogiannis

[11] Patent Number: 5,521,565

[45] Date of Patent: May 28, 1996

[54] SURFACE WAVE INTERDIGITAL TRANSDUCER AND SURFACE WAVE FILTER WITH SYMMETRIC OR PREDETERMINABLE ASYMMETRIC TRANSFER CHARACTERISTIC BETWEEN INPUT AND OUTPUT

[75] Inventor: Kimon Anemogiannis, Munich, Germany

[73] Assignee: Siemens Aktiengesellschaft, Munich, Germany

[21] Appl. No.: 210,615

[22] Filed: Mar. 18, 1994

Related U.S. Application Data

[63] Continuation-in-part of Ser. No. 663,922, filed as PCT/DE89/00552, Aug. 23, 1989, abandoned.

[30] Foreign Application Priority Data

Sep. 28, 1988 [DE] Germany .......................... 38 32 944.1

[51] Int. Cl.⁶ ..................................................... H03H 9/64
[52] U.S. Cl. ........................ 333/195; 333/193; 333/196; 310/313 B; 310/313 R
[58] Field of Search ..................................... 333/193, 194, 333/195, 196; 310/313 R, 313 B

[56] References Cited

U.S. PATENT DOCUMENTS

| | | |
|---|---|---|
| 3,870,975 | 3/1975 | Vasile . |
| 3,979,702 | 9/1976 | Hunsinger et al. . |
| 3,987,376 | 10/1976 | Kerbel . |
| 4,146,808 | 3/1979 | Laker et al. .................. 310/313 R |
| 4,468,642 | 8/1984 | Hikita . |
| 4,602,228 | 7/1986 | Yamada .................. 333/194 |
| 5,162,689 | 11/1992 | Fliegel et al. .................. 310/313 B |

FOREIGN PATENT DOCUMENTS

| | | |
|---|---|---|
| 53-20840 | 2/1978 | Japan . |
| 54-38741 | 3/1979 | Japan . |
| 5121991 | 5/1993 | Japan . |

OTHER PUBLICATIONS

"Synthesis of Periodic Unapodized Surface Wave Transducers", Ultrasonics Symposium: IEEE Ultrasonices Symposium proceedings, 1972, pp. 377–380.

Primary Examiner—Benny Lee
Assistant Examiner—Darius Gambino
Attorney, Agent, or Firm—Hill, Steadman & Simpson

[57] ABSTRACT

A surface acoustic wave interdigital transducer of a filter includes split finger electrodes in pairs. To achieve a desired transfer characteristic that is either symmetrical or deliberately asymmetrical, a number of the pairs of the split finger electrodes are replaced by single finger electrodes.

1 Claim, 4 Drawing Sheets

SURFACE WAVE INTERDIGITAL TRANSDUCER AND SURFACE WAVE FILTER WITH SYMMETRIC OR PREDETERMINABLE ASYMMETRIC TRANSFER CHARACTERISTIC BETWEEN INPUT AND OUTPUT

This is a continuation-in-part of application Ser. No. 07/663,922, filed as PCT/DE89/00552, Aug. 23, 1989, now abandoned.

BACKGROUND OF THE INVENTION

1. Field of the Invention

The present invention relates to an interdigital transducer for a surface wave filter which comprises split-finger pair electrodes and single finger electrodes, of which the split-finger pairs are disposed in accordance with a predetermined local periodic distribution, and, particularly, a low-loss filter having at least two input interdigital transducers, having at least two output interdigital transducers, and having at least one pair of coupling transducers.

2. Description of the Related Art

The transfer characteristic of a surface wave filter is determined by the geometry of the electro-acoustic interdigital transducers contained in the filter and disposed on a piezoelectric substrate, and by the topology of their arrangement. The acoustic wave which is excited in one (input) interdigital transducer can be disturbed by reflections of an electric and/or mechanical nature during its propagation in the surface of the substrate underneath the fingers of these transducers. It is known that this leads to distortions in the transfer characteristic, displacement of the center frequency and reduction in the bandwidth of the filter concerned. A more profound reason for such disturbances is the geometric deviation of the centers of excitation and of the centers of reflection of the individual transducer from one another. Such disturbances become noticeable, in particular, in the case of substrates having a high coupling factor, with relatively long transducers and/or with highly reflective finger edges.

To eliminate such defects, it has been known for a long time to construct respective interdigital transducers as split-finger transducers for avoiding such disturbances. In the case of split-finger interdigital transducers, the reflections occurring there, too, at the finger edges are suppressed by destructive interference. However, it has been found that (even) split finger interdigital transducers or filters having such transducers exhibit asymmetry in the transfer characteristic.

From Japanese patent application 53-20840, an interdigital transducer provided for a surface wave filter is known which, in addition to interdigital split-finger pairs, also has interdigitally arranged single fingers.

The purpose of the transducer with split fingers specified in the reference patent is to reduce those components of triple transit (echo) signals (hereinafter known as T.-T. signals) which occur in a known split-finger transducer when this transducer is well matched to the characteristic impedance of the filter. It is known that the split-finger transducer only has a high degree of suppression of the triple-transit signal with a "poor" match. Insertion of the single fingers into the transducer of the reference patent serves the purpose of reducing the T.-T.-signal, without influencing the transfer function of the transducer or of the filter by this action. This is indicated, in particular, by the circumstance in the case of transducers of the Japanese reference, the single fingers that are located in place of split-finger pairs can be both electrically connected and electrically unconnected (see FIGS. 3 and 4 of the Japanese document). If the connected or also non-connected single fingers were to be omitted in the transducer of the above-cited Japanese Application, this would not alter the characteristic of the transfer function but the transfer function would only exhibit additional ripples due to the T.-T.-signal occurring. If a transducer of the above-cited Japanese application has unconnected single fingers (as in FIG. 4 of the Japanese reference), its attenuation is changed.

The operation of the Japanese disclosed transducer is based on phase shifts provided in the transducer which, in turn, are based on the insertion of the single fingers in place of omitted split fingers.

As has already been mentioned above, transducers with split-finger construction have long been known. However, their application is being handled very restrictively because split-finger transducers are more difficult to manufacture because of the fact that finger spacings are reduced by a factor of 2 for filters of a predetermined cut-off frequency or one has to be satisfied with a cut-off frequency of only half this value.

The low-loss filter according to U.S. Pat. No. 4,468,642 is such a filter in a two-track arrangement. For this filter, material having a high coupling factor is used, in particular, but this leads to interfering effects resulting from internal reflections in the transducers being particularly strong. Such a known low-loss filter consists of at least six transducer structures and, as a rule, has four further structures by means of which a unidirectional effect is effected for the four end transducers at the ends of the two tracks.

If the coupling transducers are dimensioned, as is the subject matter of U.S. Pat. No. 4,468,642, in the manner specified there with regard to the number of their interdigital single fingers, a filter having a minimum transmission or insertion loss is obtained. As specified there, however, such a low-loss filter has asymmetry and ripples in the transfer characteristic. The number 2N of transducer fingers specified in accordance with the U.S. Patent also defines the bandwidth according to the substrate material.

It has been found that if the number N of the (single) finger pairs of the coupling structures deviates from the stipulation of the U.S. Patent, a considerable increase in the ripple occurs so that, in practice, such measures are not taken.

Using the invention, a filter of the type specified in principle in U.S. Pat. No. 4,468,642 can be considerably improved, namely with regard to symmetry of the transfer characteristic between input and output of this filter. This also applies to coupling transducers having a number N of transducer finger pairs deviating from the stipulation of the U.S. Patent.

SUMMARY OF THE INVENTION

It is the object of the present invention to provide an interdigital transducer having a highly symmetric transfer characteristic. It is a further development of this object to provide a filter which has a predeterminable asymmetric transfer characteristic without the necessity of weighting the transducer.

The first object is achieved by means of an interdigital transducer for a surface wave filter in which the split-finger pairs are disposed in accordance with a predetermined local periodic distribution, wherein the single fingers in the transducer are also disposed distributed in accordance with this local periodic distribution in such a manner that proportional internal reflections are present in the transducer which result in a symmetric or deliberately asymmetric transfer characteristic of this filter; and the further object is met by a filter having at least two input interdigital transducers which, referred to the input connection of the filter, are electrically connected in parallel, having at least two output interdigital transducers which, referred to the output connection of the filter, are electrically connected in parallel, and having at least one pair of coupling transducers wherein each two coupling transducers of which are identically constructed and are electrically connected in parallel and in which two input interdigital transducers and one coupling transducer of the pair of coupling transducers form an input combination of the filter and are arranged in a first track and two output interdigital transducers and the other coupling transducer of the pair of coupling transducers form an output combination and are disposed in a second track parallel to the first track, the associated coupling transducer in the input combination and in the output combination being symmetrically disposed between the two input and output interdigital transducers of this respective combination, the coupling transducer being symmetrically or antisymmetrically constructed and the respective coupling transducer receiving equal surface wave energy in phase or opposite phase from the interdigital transducers of the relevant combination, wherein, for achieving a symmetric transfer characteristic between input and output of the filter, the two coupling transducers of a respective pair of coupling transducers are constructed as transducers as described above and wherein the arrangement of the split-finger pairs, on the one hand, and the arrangement of the single fingers, on the other hand, is symmetric or antisymmetric in the respective coupling transducer.

BRIEF DESCRIPTION OF THE DRAWINGS

Attached to the present description are FIGS. 1 to 6, in which.

DETAILED DESCRIPTION OF THE PREFERRED EMBODIMENTS

Figure 1:
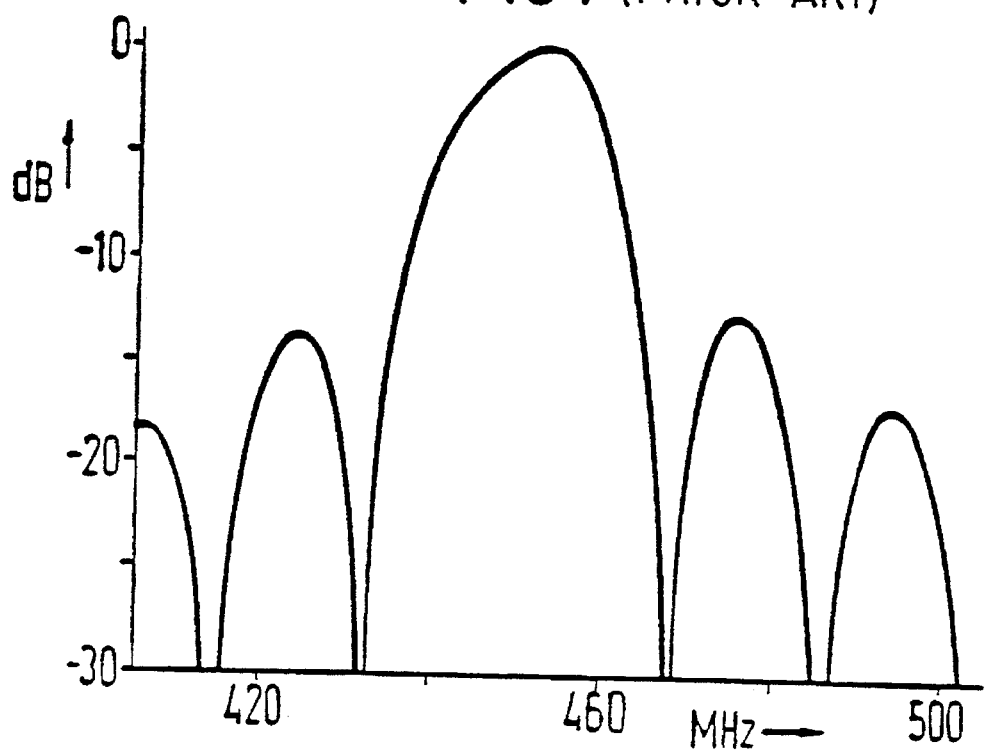
FIG. 1 shows a typical transfer characteristic of a filter with known transducers.

FIG. 1 shows the transfer characteristic of a filter having two transducers, a two-finger transducer and a (known) split-finger interdigital transducer on lithium niobate. The split-finger transducer has 51 pairs of split fingers which have a center-to-center distance of lambda/2 (wherein lambda is the center frequency of the acoustic wavelength of the transducer) of the finger pairs, that is to say lambda/8 distance between the individual fingers, from one another. In this example, the height of metallization (aluminum) of the fingers was 200 nm. The transfer characteristic of FIG. 1 shows a disturbing asymmetry, at least for more demanding requirements, which, however, is less than is shown by a filter which, instead of a split-finger construction, normally has used single fingers with a lambda/2 spacing from one another.

Figure 2:
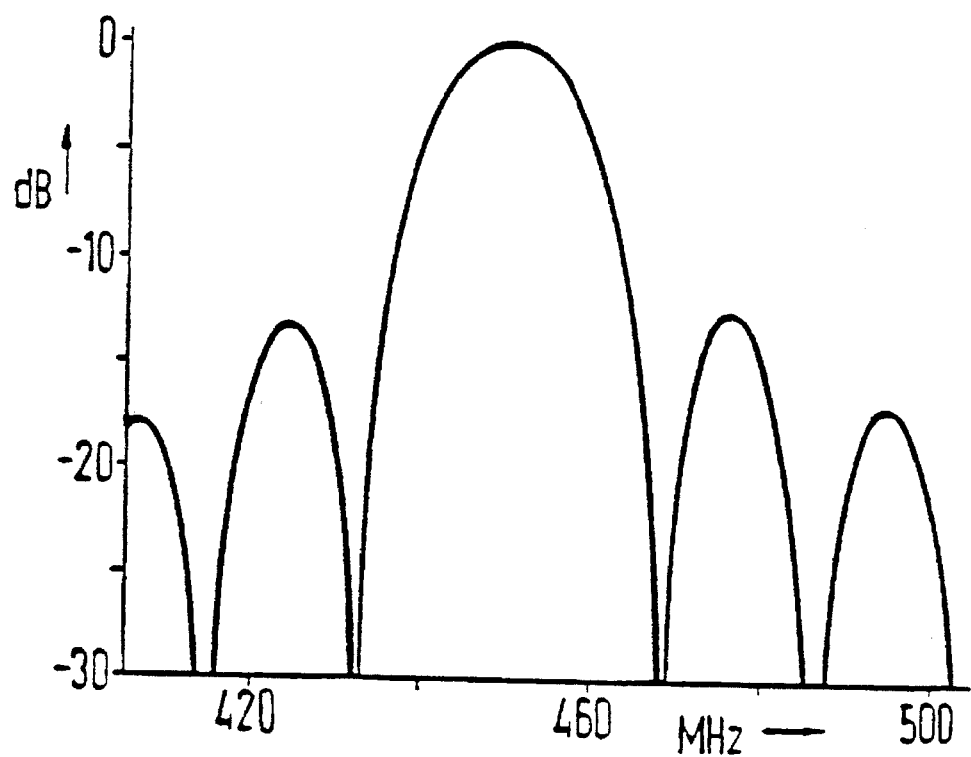
FIG. 2 shows a transfer characteristic which, according to a variant of the invention, has been made symmetrical compared with FIG. 1.
Figure 3:
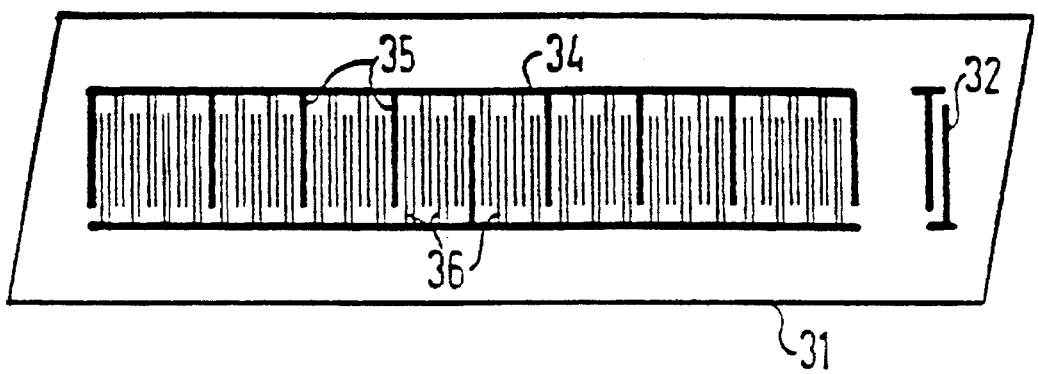
FIG. 3 shows a filter constructed in accordance with the invention.

The invention provides for replacing in a transducer, which otherwise has split fingers with a predetermined (constant) periodicity of the pairs of split fingers, a respective number of the pairs of split fingers, distributed over the split-finger transducer, by single fingers (with unchanged periodicity). Although this introduces a measure of internal reflections, which are disturbing per se, into the filter according to the invention, the number of such replaced fingers and distribution have been chosen in accordance with the invention in such a manner that any asymmetry still remaining per se in a split-finger filter is completely eliminated in favor of a symmetric transfer characteristic. The symmetric transfer characteristic of the present invention is shown in FIG. 2. FIG. 3 shows the filter constructed in accordance with the invention on which the transfer characteristic of FIG. 2 has been determined.

The substrate is designated by 31 in FIG. 3. On this substrate, a two-finger (input) transducer 32 and a split-finger-pairs/single-finger transducer 34 constructed in accordance with the invention are located on this substrate. It is a symmetric transducer 34 having 50 finger periods or 51 fingers of which nine single fingers 35 replace the same number of split-finger pairs 36.

In the text which follows, a practical rule for dimensioning a respective embodiment of the invention is specified: regularly predetermined values are the center frequency, the bandwidth and the stop-band attenuation. The achievement of a minimum insertion loss, symmetric or predetermined asymmetric transfer characteristic and minimized ripple in the pass band are also mandatory.

The center frequency gives the finger period of the split-finger pairs (and single fingers) of the split-finger transducer constructed in accordance with the invention. The bandwidth determines the number of finger periods, that is to say the length of the transducer. In weighting by omission, not all finger periods are occupied with split-finger pairs or single fingers. The stop-band attenuation and selectivity of the filter is achieved by weighting which is dimensioned in a known manner. According to the invention, the symmetry is achieved by partial replacement of pairs of split fingers by single fingers. The dimensioning associated with this is numerically determined. A preferred approach is first to replace a small number of symmetrically distributed and periodically or equidistantly positioned split-finger pairs by single fingers. The number of split-finger pairs to be replaced is progressively increased until a result is achieved which is close to the optimum with respect to the predetermined shape, particularly symmetrical shape, of the transfer characteristic. The optimum itself is then iteratively determined, for example in accordance with the Hamming distance method. Any necessary further fine tuning can be achieved by means of phase weighting by finger shifting of the existing single fingers.

Based on the concept of the invention a filter can also be specified which, instead of perfect symmetry of the transfer characteristic, has a deliberately predetermined asymmetry of this characteristic. The asymmetrical transfer characteristic can be achieved if the number and distribution of the single fingers replacing split finger pairs according to the invention is correspondingly disposed. The predetermined asymmetry to be achieved can be achieved by means of the invention even without additional weighting of the transducer. Using, for example, phase weighting, the transfer characteristics can be "fine tuned". The internal reflections of the transducer are set by choice of number and distribution of single fingers in such a manner that an interference of excited waves and of waves reflected in accordance with the invention leads to the predetermined transfer characteristic.

In conjunction with the invention, it was found that an additional finger weighting such as overlap weighting, weighting by omission and so forth of a transducer or filter constructed in accordance with the invention does not have any negative influence on the symmetric or predetermined asymmetric shape of the transfer characteristic of a filter constructed in accordance with the invention.

Figure 4:
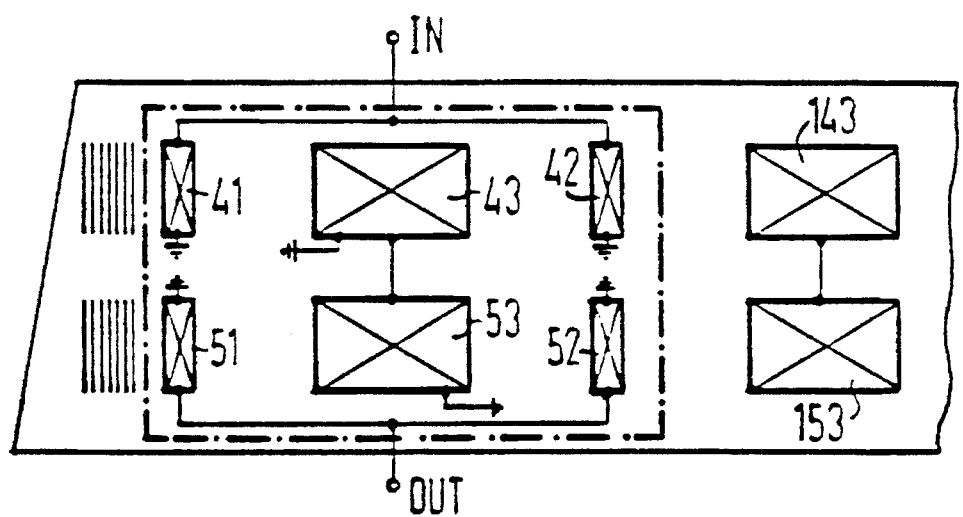
FIG. 4 shows a filter having coupling transducers constructed in accordance with the invention.

A transducer constructed in accordance with the invention with split-finger pairs and single fingers 35 replacing split-finger pairs 36 finds particularly advantageous application in a low-loss surface wave filter as described in U.S. Pat. No. 4,468,642. In particular, attention is drawn to the embodiments according to FIGS. 1, 4 and 5 disclosed in the U.S. Pat. No. 4,686,642 and to the instruction for technical action contained in this printed document. FIG. 4 of the present invention reproduces a basic diagram of such a known filter.

Figure 5:
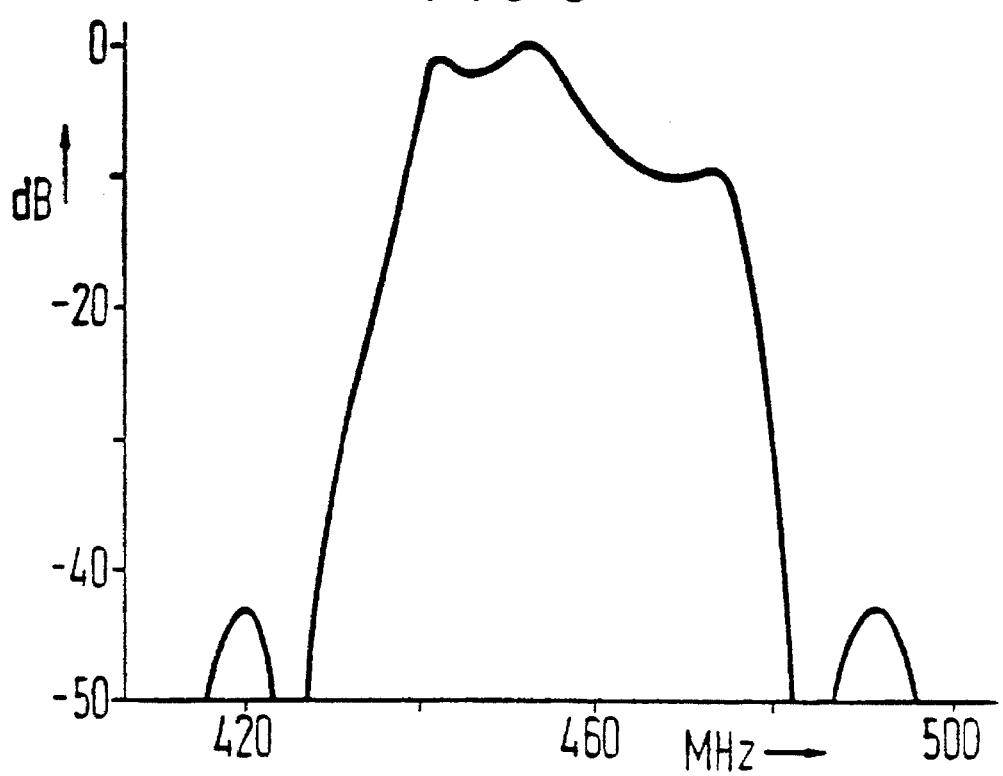
FIG. 5 shows a typical transfer characteristic of a filter according to FIG. 4 having conventional coupling transducers.

FIG. 5 of the present specification shows an extended embodiment of such a known filter having nine, that is to say more than three, interdigital transducers per track. As can be seen, five transducers of the upper track are connected in parallel with one another as input transducers. A further interdigital transducer, to be called a coupling transducer, is located between each two such transducers. This correspondingly applies to the lower row of parallel-connected transducers as output of the filter. One coupling transducer each of the upper row is electrically connected to a coupling transducer of the lower row. The construction of the transducers of the upper row and lower row of the filter is symmetric.

It is sufficient for further explanation of the present invention to continue by describing the cell of the filters of the attached FIG. 4 delimited by dashed lines. The two interdigital transducers 41 and 42 operated, for example, as input transducers and the transducer 43 arranged between these transducers 41 and 42 together form an input transducer combination. This correspondingly applies to the output transducer combination with transducers 51, 52 and 53 of the lower row. Elements 143 and 153 designate coupling transducers of the adjoining repeated portion of the filter.

The two coupling transducers 43 and 53 mentioned are electrically connected to one another and form a pair of coupling transducers. These two coupling transducers 43 and 53 are identical in their construction and are electrically connected in parallel. The (respective) pair of coupling transducers forms the connection, existing inside the filter, between the input transducer combination and the output transducer combination. It must be pointed out with regard to the coupling transducers 43 and 53 that these are symmetrically or antisymmetrically constructed transducers of the (respective) cell of this low-loss filter. The (input) transducers 41 and 42 arranged on both sides of the plane of symmetry (or of the center of symmetry in the case of an antisymmetric transducer 43) of the coupling transducer 43 and the coupling transducer 43 are constructed and arranged in such a manner that the coupling transducer 43 is supplied with surface wave energy of the same intensity and with mutually identical phase or in opposite phase from both transducers 41, 42, that is to say from both sides.

If the invention is applied, the two coupling transducers of a respective pair of coupling transducers, thus, for example, transducers 43 and 53, have split-finger pairs and single fingers. Here, too, the split-finger pairs prevent internal reflections emanating from themselves. However, the single fingers selectively produce internal reflections in the transducer. The single fingers are arranged distributed symmetrically or antisymmetrically in the here necessarily symmetric or antisymmetric coupling transducer which is otherwise equipped with split-finger pairs. The coupling transducers 43, 53 constructed in accordance with the invention are thus symmetric or antisymmetric arrangements, even including the fact that two types of transducer fingers are provided.

An embodiment according to the invention of a filter according to the principle of the U.S. Pat. No. 4,468,642 or of a filter according to FIG. 4, respectively, is that in which the coupling transducers 43 and 53 are each a transducer 34 according to FIG. 3. Since this transducer 34 of the filter according to FIG. 3 is a symmetric transducer, which would not be necessary for the filter specified there, the relevant boundary condition for the low-loss filter of FIG. 4 is also satisfied. Transducers 41 and 42, and 51 and 52, are again the input and output transducers, respectively.

Figure 6:
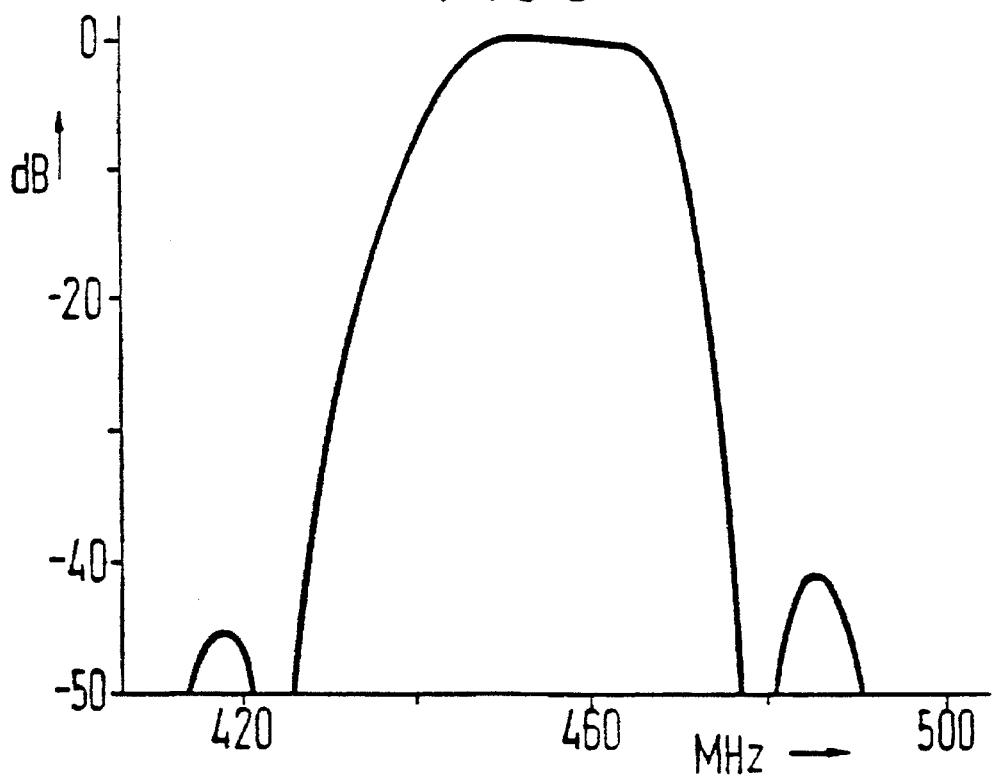
FIG. 6 shows a transfer characteristic, having a more desirable shape compared with FIG. 5, of a filter according to FIG. 4.

The progress of the invention will be documented in a practical comparison with reference to two examples. A filter according to FIG. 4 was produced (with three transducers each per track, that is to say with one pair of coupling transducers). Each of these coupling transducers 43, 53 had an effective length of 50 (geometric) finger periods with 45 interdigitally arranged single fingers having the conventional lambda/2 center-to-center distance from one another. The number of single fingers, which is slightly reduced compared with the number of periods, is based on a finger omission weighting carried out in order to maintain the predetermined bandwidth. FIG. 5 shows the transfer characteristic associated with this filter having coupling transducers provided with single fingers, which exhibits the evidently considerable irregularities in the pass band, due to strong internal reflections, as has been recognized in accordance with the invention. The comparison example constructed in accordance with the invention, again having 51 finger periods and 45 fingers, per coupling transducer 43 and 53 but with 25 split-finger pairs and 20 single fingers, due to strong internal reflections, provided in accordance with the invention, per transducer 43, 53, in symmetric arrangement in each case, produces the filter characteristic according to FIG. 6. A comparison between FIGS. 6 and 5 shows the advance achieved by means of the invention.

The construction according to the invention of a split-finger transducer with symmetric or antisymmetric replacement of split-finger pairs by single fingers is here called partial splitting.

A predetermined asymmetric transfer characteristic can be achieved for a filter, for example one according to FIG. 3 or according to FIG. 4, in that in the split-finger pair transducer 34; 43, 53, a number and a distribution of single fingers replacing split fingers is provided which results in the objective function. For this purpose, the dimensioning methods including iterations used above for a symmetric transfer characteristic are carried out.

To suppress ripples in a low-loss filter described above, which are based on double-transit signals, it is suitable to arrange the transducers 41 to 53 at a distance from one another in such a manner as is described in the application PCT/DE 89/00553 (WO90/03691) of the same date.

Figure 7:
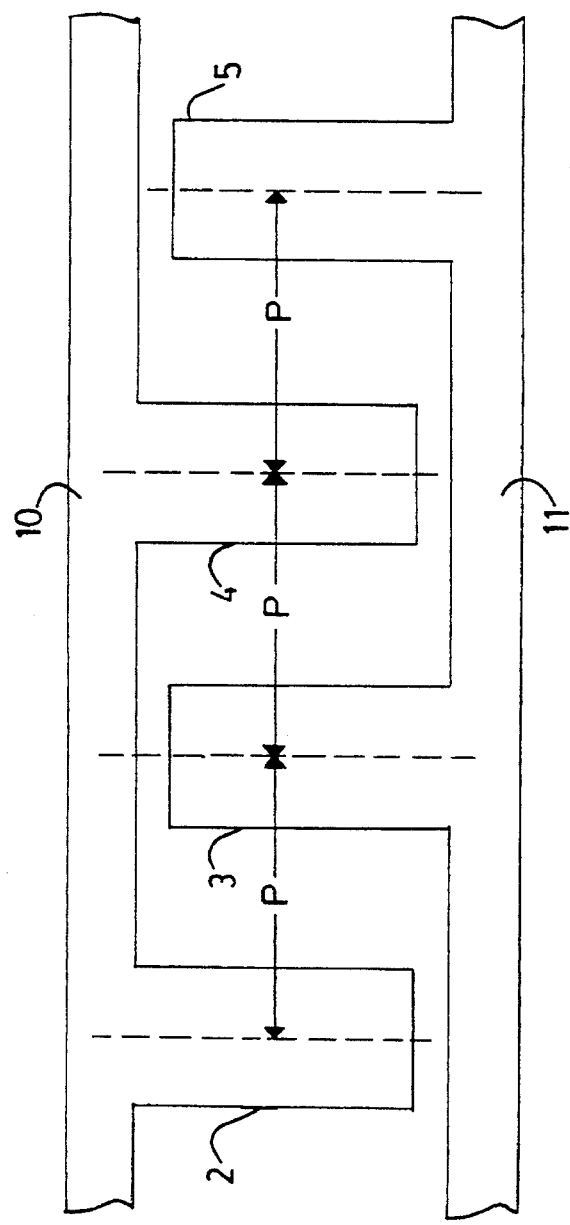
FIG. 7 is an enlarged view of a standard interdigital transducer.

FIG. 7 shows an excerpt from a standard interdigital transducer with discrete fingers. Respectively two discrete fingers 2, 4 or, respectively, 3, 5 connected to a respective busbar 10 or, respectively, 11 are shown in the excerpt. In such interdigital transducers, the periodicity is defined as the spacing of finger center to finger center of respectively two neighboring fingers. This periodicity is referenced P in FIG. 7. As may be seen from the figure, the spacing of finger center to finger center are respectively two neighboring fingers is the same, i.e. a constant, invariable periodicity P is present in the overall interdigital transducer.

Figure 8:
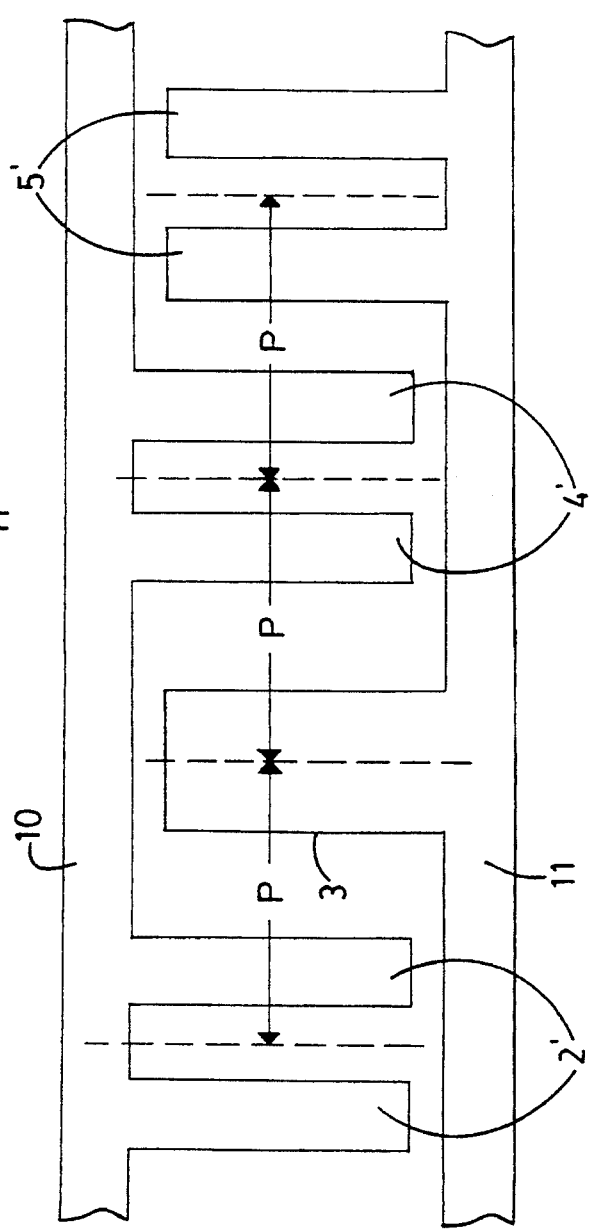
FIG. 8 is an enlarged view of an interdigital transducer according to the present invention.

According to the instant invention, an interdigital transducer is provided wherein both discrete fingers as well as split fingers are present. An enlargement of the present interdigital transducer is shown in FIG. 8. As this figure shows, split fingers 2', 4' and 5' as well as discrete fingers 3 are provided in this transducer. The reference characters have been selected for the purpose of comparison to FIG. 7. In the illustrated way, a finger center can likewise be defined for the split fingers 2', 4' and 5' corresponding to the discrete fingers.

The invention is then to be seen therein that the fingers in an interdigital transducer having both split fingers as well as having discrete fingers are arranged such that a constant, non-variable periodicity P=Lambda/2 according to the illustration of FIG. 8 derives.

Although other modifications and changes may be suggested by those skilled in the art, it is the intention of the inventor to embody within the patent warranted hereon all changes and modifications as reasonably and properly come within the scope of his contribution to the art.

I claim:

1. An electro-acoustic interdigital transducer of a surface acoustic wave filter on a piezoelectric substrate, the surface acoustic wave filter having a predetermined acoustic center frequency wave length, comprising:

split-finger pairs of electrodes and single finger electrodes interleaved to form said transducer, each of said single finger electrodes defining a center midway along its width, each pair of split finger electrodes defining a center midway between said pair, both said split-finger pairs of electrodes and said single finger electrodes are positioned in accordance with a constant center to center spacing, said center to center spacing being equal to one half of said predetermined acoustic center frequency wavelength.

* * * * *